United States Patent
Lee (10) Patent No.: US 8,952,734 B2
(45) Date of Patent: Feb. 10, 2015

(54) FREQUENCY-CONTROL CIRCUITS AND SIGNAL GENERATION DEVICES USING THE SAME

(71) Applicant: Via Technologies, Inc., New Taipei (TW)

(72) Inventor: Yeong-Sheng Lee, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 60 days.

(21) Appl. No.: 13/850,666

(22) Filed: Mar. 26, 2013

(65) Prior Publication Data

US 2013/0222020 A1   Aug. 29, 2013

Related U.S. Application Data

(62) Division of application No. 13/588,525, filed on Aug. 17, 2012, now Pat. No. 8,570,080.

(60) Provisional application No. 61/532,208, filed on Sep. 8, 2011.

(51) Int. Cl.
*H03L 7/00* (2006.01)
*H03L 7/14* (2006.01)
*H04L 27/00* (2006.01)

(52) U.S. Cl.
CPC . *H03L 7/14* (2013.01); *H04L 27/00* (2013.01)
USPC .......................................................... 327/143

(58) Field of Classification Search
USPC ....................... 327/39–49, 143–153
See application file for complete search history.

(56) References Cited

U.S. PATENT DOCUMENTS

| | | | |
|---|---|---|---|
| 6,973,145 B1 * | 12/2005 | Smith et al. | 375/354 |
| 7,038,508 B2 * | 5/2006 | Parker et al. | 327/156 |
| 8,525,560 B2 * | 9/2013 | Lalla | 327/112 |
| 2008/0024168 A1 * | 1/2008 | Wu et al. | 326/82 |

* cited by examiner

*Primary Examiner* — Sibin Chen
(74) *Attorney, Agent, or Firm* — McClure, Qualey & Rodack, LLP (57) ABSTRACT

A signal generation device is provided to generate an output signal with constant frequency. The signal generation device includes a frequency-control circuit and a voltage-controlled delay line. The frequency-control circuit includes a pulse generator, generating a reference pulse signal according to a transition of the reference signal and a comparison pulse signal according to a transition of the comparison result signal, to re-shape the reference signal and the comparison result signal into narrow pulses suitable for clocking and resetting flip-flops.

11 Claims, 7 Drawing Sheets

FREQUENCY-CONTROL CIRCUITS AND SIGNAL GENERATION DEVICES USING THE SAME

CROSS REFERENCE TO RELATED APPLICATIONS

This application is a divisional of U.S. application Ser. No. 13/588,525, filed on Aug. 17, 2012, now U.S. Pat. No. 8,570,080, which claims the benefit of U.S. Provisional Application No. 61/532,208, filed on Sep. 8, 2011, the contents of which are incorporated herein by reference.

BACKGROUND OF THE INVENTION

1. Field of the Invention

The invention relates to a frequency-control circuit, and more particularly to a frequency-control circuit applied in a signal generation device for controlling a frequency of an output signal of the signal generation device.

2. Description of the Related Art

In general, a PWM-type voltage converter comprises an operation amplifier circuit and a comparator (acting as an oscillator) in a feedback path. The ripple frequency of the output signal of the PWN-type voltage converter is determined by the frequency of the saw-tooth signal received by the comparator. However, the operation amplifier circuit comprises many capacitors with large capacitance values and resistors with large resistance values which occupy a large area, and thus the whole area of the PWM-type buck converter is large. Due to the large RC compensation, the transient response of the PWM-type buck converter is slow. Moreover, for PWM-type voltage converters with wide supply (e.g., 5-25 V) and output (e.g., 1-5 V) voltage ranges, it is almost impossible for the ripple frequency of the saw-tooth signal to be eligible for the entire voltage range, and therefore it is difficult to design the operation amplifier circuit for high stability. Thus, a hysteretic voltage converter is provided. In a hysteretic voltage converter, a hysteretic comparator replaces the operation amplifier circuit of the PWN-type buck converter, and the oscillator for the carrier waveform is not needed. This greatly reduces the design and layout area comparing with the PWM type. However, the frequency of the output signal of the hysteretic voltage converter is determined by the hysteresis level. Thus, it is difficult to achieve a fixed constant frequency for the output signal.

BRIEF SUMMARY OF THE INVENTION

An exemplary embodiment of a signal generation device is provided to generate an output signal with constant frequency. The signal generation device comprises a frequency-control circuit and a voltage-controlled delay line. The frequency-control circuit is arranged to charge/discharge a voltage-control node according to a comparison result signal. The voltage-controlled delay line is arranged to generate a control signal according to the comparison result signal and a control voltage of the voltage-control node to control the output signal. A frequency of the control signal is modulated by the voltage-controlled delay line according to the control voltage of the voltage-control node. The comparison result signal is generated according to a difference between a reference voltage and a voltage level of the output signal.

An exemplary embodiment of a frequency-control circuit is provided to match a frequency of a comparison result signal to a frequency of a reference signal. The frequency-control circuit comprises a pulse generator. The pulse generator is arranged to generate a reference pulse signal according to a transition of the reference signal and a comparison pulse signal according to a transition of the comparison result signal, to re-shape the reference signal and the comparison result signal into narrow pulses suitable for clocking and resetting flip-flops.

An exemplary embodiment of a frequency controller is provided to detect whether a frequency of a comparison pulse signal is higher or lower than a frequency of a reference pulse signal. The frequency controller comprises first, second, third, and fourth flip-flops. A CLOCK-input of the first flip-flop receives the reference pulse signal, and a RESET-input thereof receives the comparison pulse signal. A D-input of the second flip-flop is coupled to a Q-output of the first D flip-flop, a CLOCK-input thereof receives the reference pulse signal, a RESET-input thereof receives the comparison pulse signal, and a Q-output thereof outputs a frequency increase signal. A CLOCK-input of the third flip-flop receives the comparison pulse signal, and a RESET-input thereof receives the reference pulse signal. A D-input of the fourth flip-flop is coupled to a Q-output of the third D flip-flop, a CLOCK-input thereof receives the comparison pulse signal, a RESET-input thereof receives the reference pulse signal, and a Q-output thereof outputs a frequency decrease signal. The frequency increase signal is asserted when more than one pulse of the reference pulse signal is received in one cycle of the comparison pulse signal. The frequency decrease signal is asserted when more than one pulse of the comparison pulse signal is received in one cycle of the reference pulse signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is therefore required to develop a simple and robust frequency-control circuit, and more particularly a frequency-control circuit applied in a signal generation device. The developed signal generation device with a frequency-control circuit has the advantage of frequency stability as in PWM voltage converters, and the advantage of simple design as in hysteretic voltage converters. It also allows the desired output frequency to be independent of supply and output voltages and resolves the wide voltage range issue.

Figure 1:
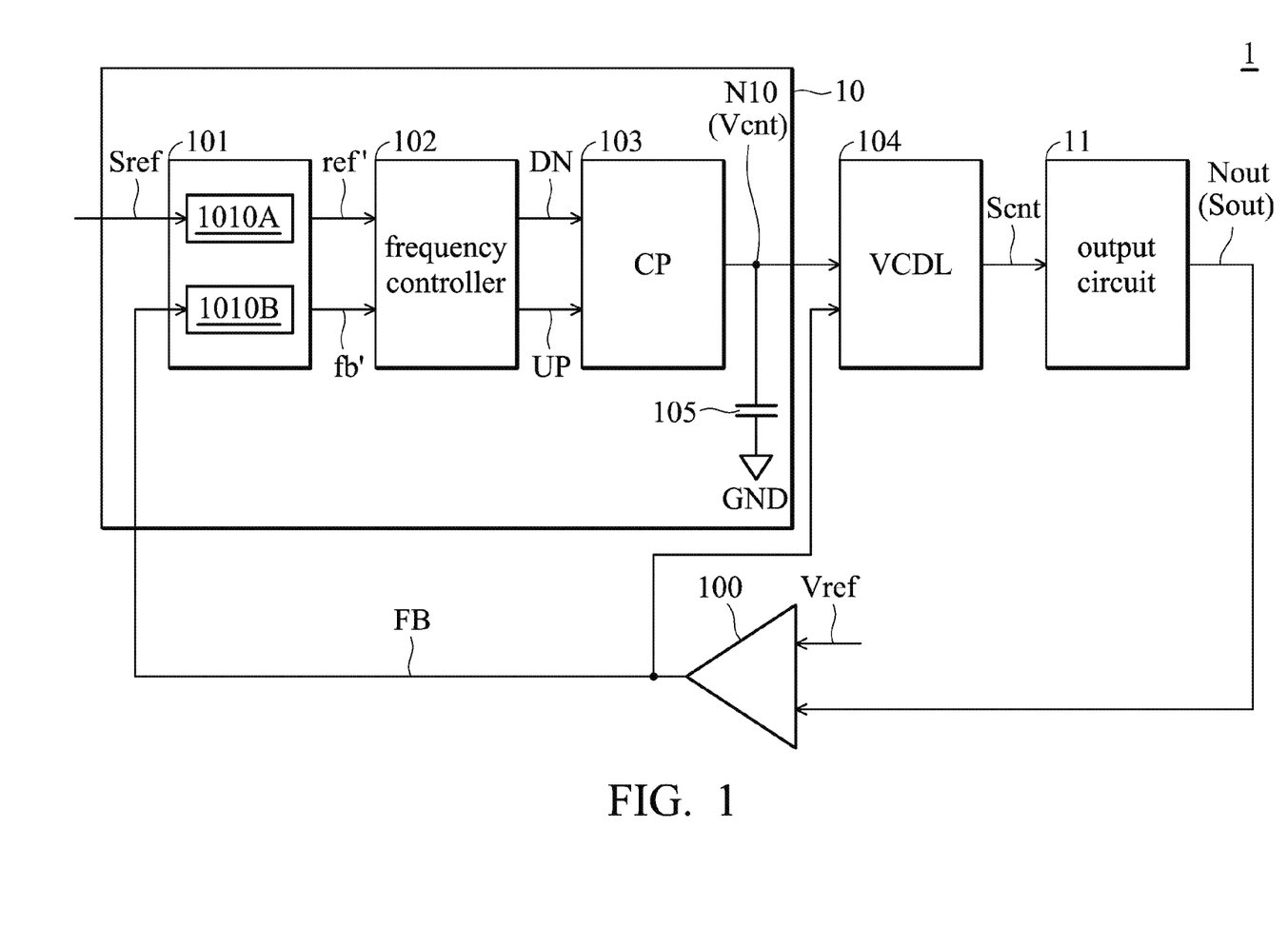
FIG. 1 shows one exemplary embodiment of a signal generation device.

In an exemplary embodiment of a signal generation device in FIG. 1, a signal generation device 1 comprises a frequency-control circuit 10, an output circuit 11, a voltage comparator 100, and a voltage-controlled delay line (VCDL) 104. The output circuit 11 generates an output signal Sout at an output node Nout. The voltage comparator 100 is coupled to the output circuit 11 to receive the output signal Sout and generate a comparison result signal FB. The frequency-control circuit 10 generates a control voltage Vcnt of a voltage-control node N10 and controls the voltage level of the control voltage Vcnt according to the comparison result signal FB. The voltage-controlled delay line 104 is coupled to the frequency-control circuit 10 and the voltage comparator 100 to respectively receive the control voltage Vcnt and the comparison result signal FB and generate a control signal Scnt. The output circuit 11 receives the control signal Scnt to control the frequency of the output signal Sout. In one embodiment, the output circuit 11 comprises a voltage converter.

The detailed structure and operation of the frequency-control circuit 10 will be described in the following. Referring to FIG. 1, the frequency-control circuit 10 comprises a pulse generator 101, a frequency controller 102, a charge pump (CP) 103, and a capacitor 105. In one embodiment, the voltage comparator 100 is implemented by a hysteretic comparator. The voltage comparator 100 is coupled to the output node Nout to receive the output signal Sout. The voltage comparator 100 further receives a reference voltage Vref and compares the reference voltage Vref with the voltage level of the output signal Sout. The voltage comparator 100 generates the comparison result signal FB according to the difference between the reference voltage Vref and the voltage level of the output signal Sout. Due to the constant voltage level of the reference voltage Vref, the frequency of the comparison result signal FB is equal to the frequency of the output signal Sout, wherein the duty ratio of the comparison signal FB varies. As shown in FIG. 1, the pulse generator 101 comprises two one-shot generators 1010A and 1010B. In one embodiment, the one-shot generators may be monostable multivibrators. Each of the one-shot generators may receive an input signal and generate a narrow pulse when there is a transition in the voltage level of the input signal. In one embodiment, such a transition in the voltage level is from low voltage to high voltage. The one-shot generator 1010A receives a reference signal Sref and generates a reference pulse signal ref' according to the transition of the reference signal Sref. The one-shot generator 1010B receives the comparison result signal FB and generates a comparison pulse signal fb' according to the transition of the comparison result signal FB. Thus, the frequencies of the pulse signals ref' and fb' are determined by the frequencies of the reference signal Sref and the comparison result signal FB, respectively. The pulse generator 101 therefore re-shapes the input signals into narrow pulses suitable for clocking and resetting flip-flops in the following stage.

The frequency controller 102 is coupled to the pulse generator 101 to receive the pulse signals ref' and fb' for detecting whether the frequency of the comparison pulse signal fb' is higher than or lower than the frequency of the reference pulse signal ref'. The frequency controller 102 performs a comparison operation to the pulse signals ref' and fb' to generate a frequency decrease signal DN or a frequency increase signal UP. The capacitor 105 is coupled to the voltage-control node N10 and a reference ground GND. The chare pump 103 discharges or charges the voltage-control node N10 according to the frequency decrease signal DN or the frequency increase signal UP to vary the voltage level of the control voltage Vcnt of the voltage-control node N10, that is to vary the numbers of charges stored in the capacitor 105. The voltage-controlled delay line 104 receives the comparison result signal FB and generates the control signal Scnt according to the comparison result signal FB. As shown in FIG. 1, the voltage-controlled delay line 104 is coupled to the voltage-control node N10. The delay time of the voltage-controlled delay line 104 is determined by the voltage level of the control voltage Vcnt to modulate the frequency of the control signal Scnt. The output circuit 11 receives the control signal Scnt and generates the output signal Sout according to the control signal Scnt. Particularly, the frequency of the output signal Sout is controlled according to the frequency of the control signal Scnt. Thus, when the control voltage Vcnt is varied, the frequency of the control signal Scant is also varied, thereby controlling the output signal Sout to have a desired frequency.

Figure 2:
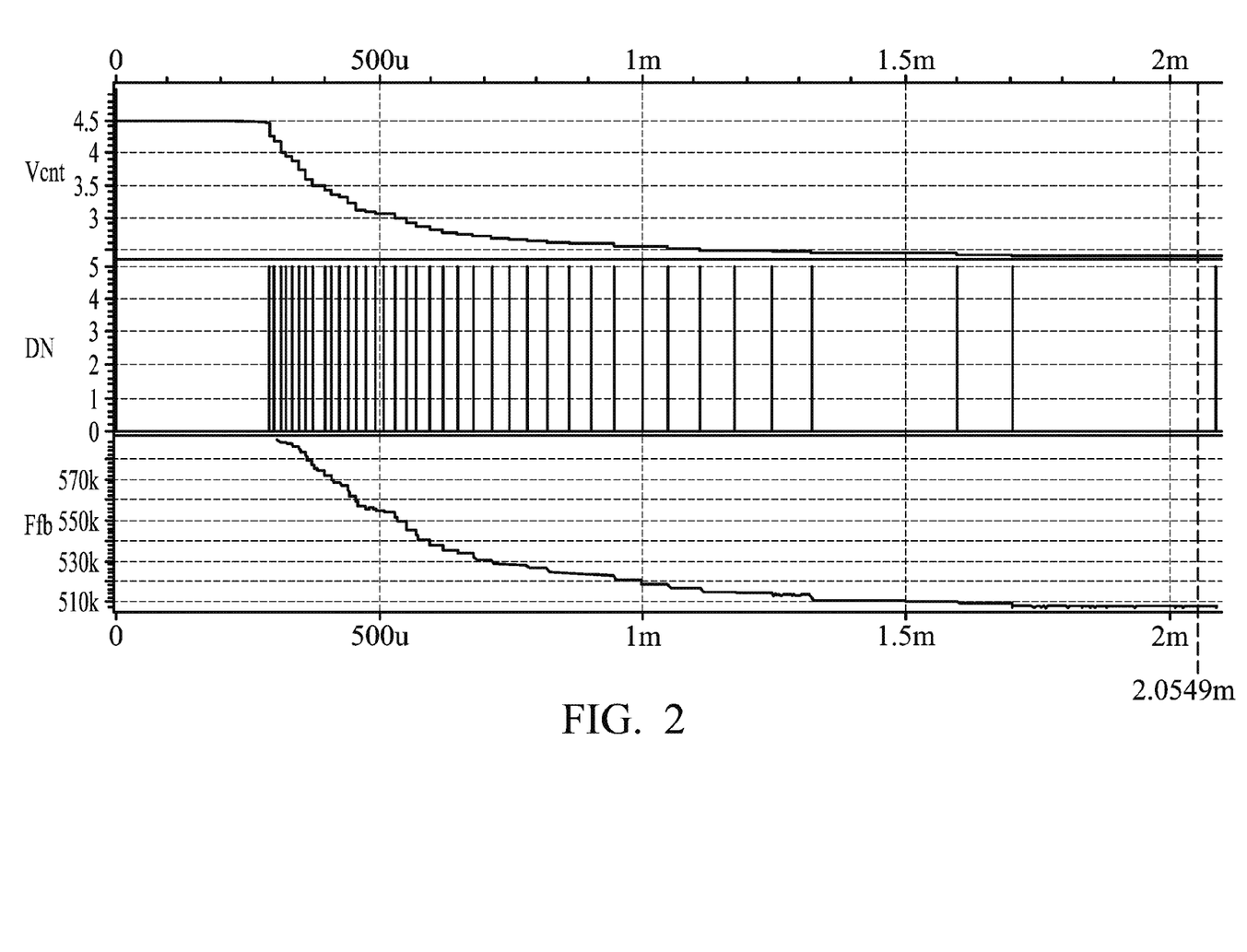
FIG. 2 shows a timing chart of key signals of the signal generation device in FIG. 1.

If the frequency controller 102 detects more than one pulse of the comparison pulse signal fb' in one clock cycle of the reference pulse signal ref', which indicates that the frequency of the comparison pulse signal fb' is higher than reference pulse signal ref', the frequency controller 102 generates the frequency decrease signal DN. The charge pump 103 discharges the voltage-control node N10 according to the frequency decrease signal DN, and the voltage level of the control voltage Vcnt lowers, as shown in FIG. 2. The voltage-controlled delay line 104 decreases the frequency of the control signal Scnt according to the control voltage Vcnt with the lowering voltage level. Accordingly, the frequency of the output signal Sout is decreased. Through the operations of the voltage comparator 100 and the pulse generator 101, the frequency Ffb of the comparison pulse signal fb' is decreased, as shown in FIG. 2. When the frequency of the comparison pulse signal fb' is decreased to match with that of the reference pulse signal ref', the frequency controller 102 stops generating the frequency decrease signal DN. At this time, the output signal Sout is at the desired frequency.

If the frequency controller 102 detects more than one pulse of the reference pulse signal ref' in one clock cycle of the comparison pulse signal fb', which indicates that the frequency of the comparison pulse signal fb' is lower than reference pulse signal ref', the frequency controller 102 generates the frequency increase signal UP. The charge pump 103 charges the voltage-control node N10 according to the frequency increase signal UP, and the voltage level of the control voltage Vcnt rises. The voltage-controlled delay line 104 increases the frequency of the control signal Scnt according to the control voltage Vcnt with the rising voltage level. Accordingly, the frequency of the output signal Sout is increased. Through the operations of the voltage comparator 100 and the pulse generator 101, the frequency of the comparison pulse signal fb' is increased. When the frequency of the comparison pulse signal fb' is increased to match with the reference pulse signal ref', the frequency controller 102 stops generating the frequency increasing signal UP. At this time, the output signal Sout is at the desired frequency.

Figure 3:
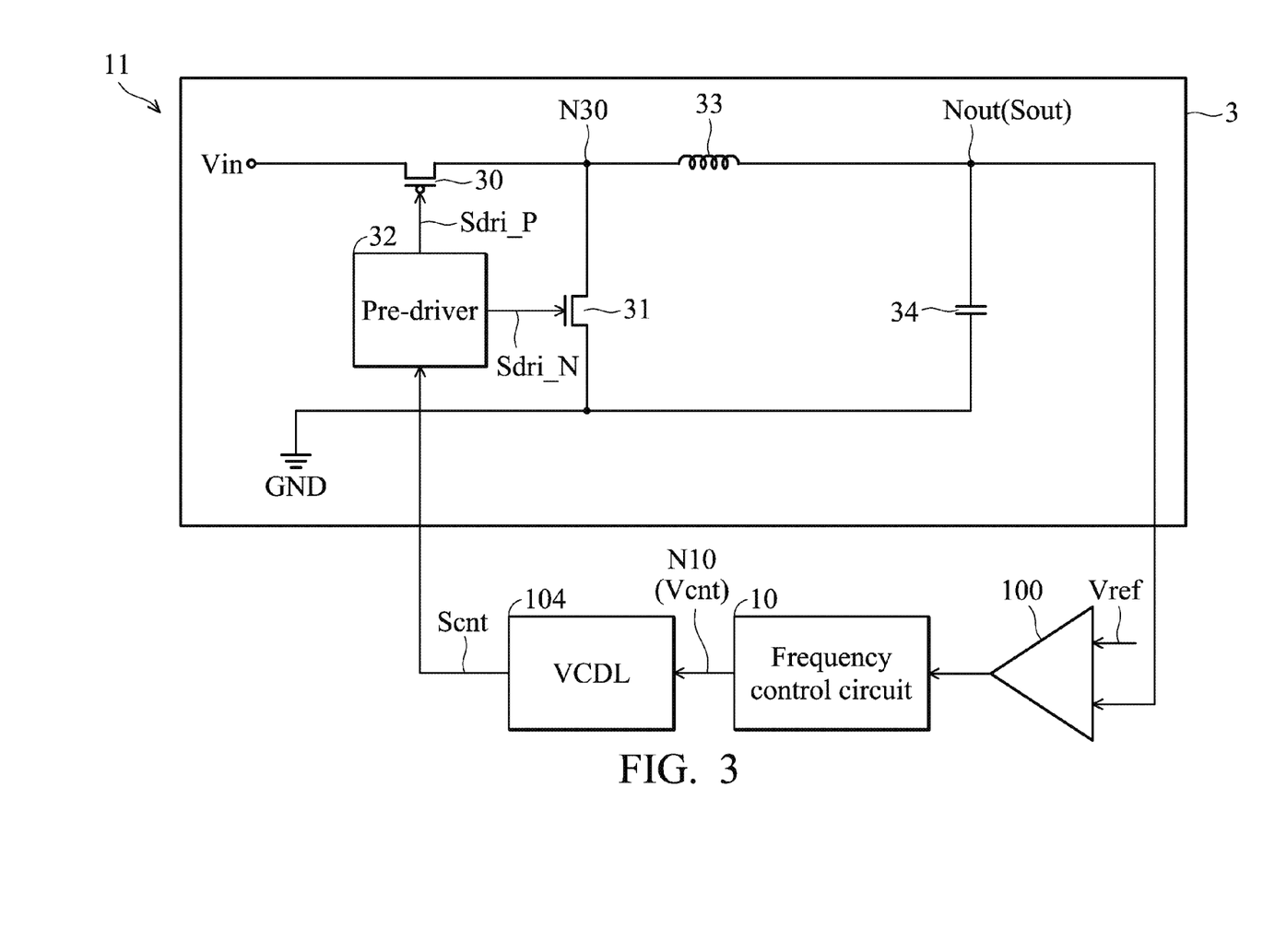
FIG. 3 shows an exemplary embodiment of an output circuit in FIG. 1.

FIG. 3 shows the output circuit 11 in FIG. 1. For clarity, FIG. 3 also shows the frequency-control circuit 10, the voltage comparator 100, and the VCDL 104. In one embodiment, the output circuit 11 comprises a buck converter 3. As shown in FIG. 3, the buck converter 3 comprises a charging switch 30, a discharging switch 31, a pre-driver 32, an inductor 33, and a capacitor 34. The pre-driver 32 is coupled to the voltage-controlled delay line 104 and receives the control signal Scnt from the voltage-controlled delay line 104. The pre-driver 32 generates driving signals Sdri_P and Sdri_N according to the control signal Scnt. The asserted level of the driving signal Sdri_P does not overlap with an asserted level of the driving signal Sdri_N. In one embodiment, the charging switch 30 is implemented by a P-type metal-oxide-semiconductor (PMOS) transistor, while the discharging switch 31 is implemented by an N-type MOS (NMOS) transistor. The drain (referred to as a first electrode) of the PMOS transistor 30 is coupled to a node N30, the source (referred to as a second electrode) thereof receives to an input voltage Vin, and the gate (referred to as a control electrode) thereof receives the driving signal Sdri_P. The drain of the NMOS transistor 31 is coupled to the node N30, the source thereof is coupled to the reference ground GND, and the gate thereof receives the driving signal Sdri_N. When the driving signal Sdri_P or Sdri_N is at the asserted level, the corresponding transistor 30 or 31 is turned on. Due to the asserted levels of the driving signals Sdri_P and Sdri_N not overlapping, the transistors 30 and 31 are turned on at different times.

As shown in FIG. 3, one terminal of the inductor 33 is coupled to the node N30, and the other terminal thereof is coupled to the output node Nout. The capacitor 34 is coupled between the output node Nout and the reference ground GND. As described above, through the operations of the voltage comparator 100, the pulse generator 101, the frequency controller 102, the charge pump 103, and the voltage-controlled delay line 104 in FIG. 1, the frequency-control circuit 10 varies the frequency of the control signal Scnt. The buck converter 3 receives the control signal Scnt and generates the output signal Sout at the output node Nout. The frequency of the output signal Sout is controlled by the frequency of the control signal Scnt. Therefore, the ripple frequency of the output node Nout is stable and follows that of the reference signal Sref. The voltage of the output node Nout is forced to follow the reference voltage Vref during the charging or discharging process. Although a buck type DC-to-DC voltage converter is used in here as an example, the invention is not limited thereto.

Figure 4:
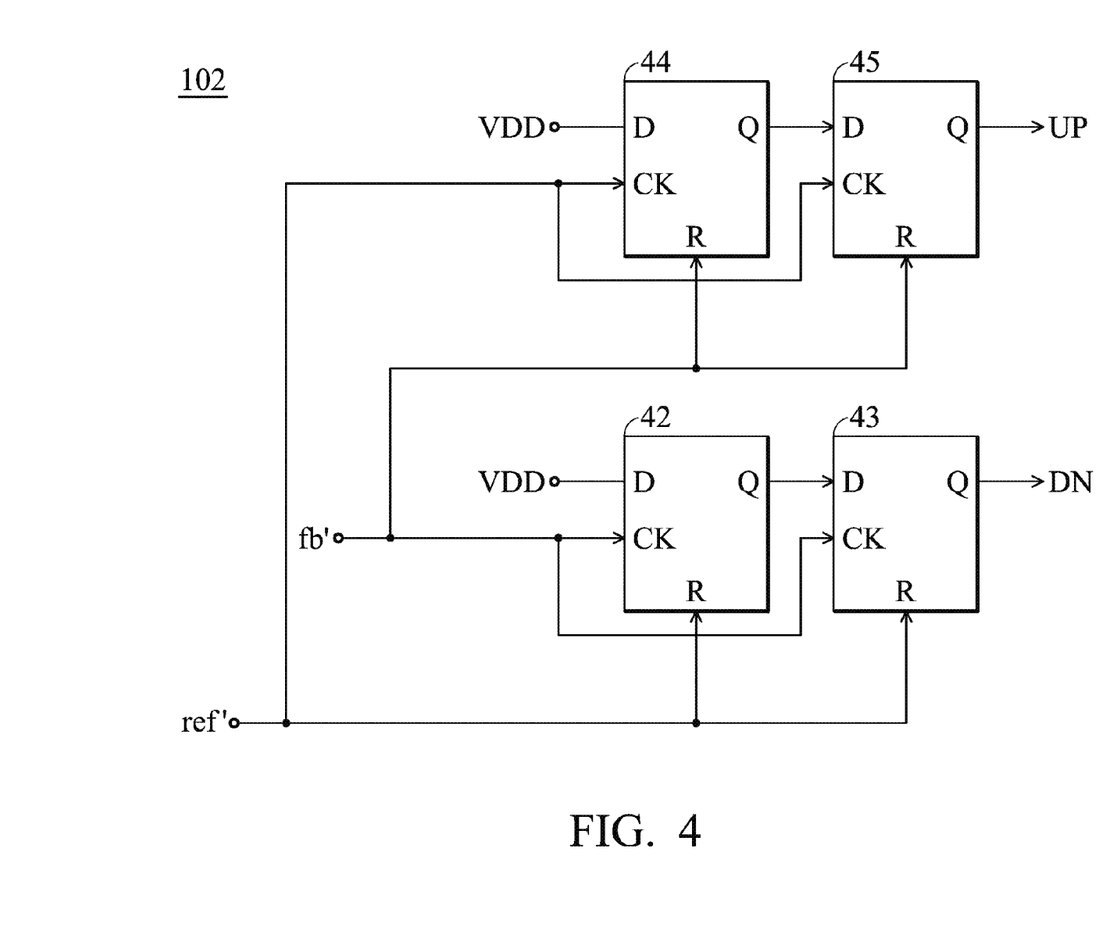
FIG. 4 shows one exemplary embodiment of a frequency controller of the signal generation device in FIG. 1.

FIG. 4 shows a detailed diagram of one exemplary embodiment of the frequency controller 102. The frequency controller 102 comprises two pairs of cascaded flip-flops. The first pair of flip-flops 44 and 45 corresponds to the generation of the frequency increase signal UP, while the second pair of flip-flops 42 and 43 corresponds to the generation of the frequency decrease signal DN.

The CLOCK-inputs (CK) of the flip-flops 44 and 45 receive the reference pulse signal ref', while the RESET-inputs (R) of the flip-flops 44 and 45 receive the comparison pulse signal fb'. The D-input (D) of the flip-flop 44 receives an operation voltage VDD, the Q-output (Q) of the flip-flop 44 is coupled to the D-input of the flip-flop 45, and the Q-output of the flip-flop 45 outputs the frequency increase signal UP. The two flip-flops 44 and 45 therefore act like a 2-bit shift register. If the reference pulse signal ref' has two consecutive pulses without being reset by the comparison pulse signal fb', then the frequency increase signal UP will be outputted as the operation voltage VDD until it gets reset by the comparison pulse signal fb'. Such a scenario occurs to activate the frequency increase signal UP when the frequency of the comparison pulse signal fb' is lower than reference pulse signal ref'. When the frequency of the comparison pulse signal fb' is higher than reference pulse signal ref', no frequency increase signal UP is activated since the two flip-flops 44 and 45 are reset by the comparison pulse signal fb' before the operation voltage VDD can be outputted.

The CLOCK-inputs of the flip-flops 42 and 43 receive the comparison pulse signal fb', while the RESET-inputs of the flip-flops 42 and 43 receive the reference pulse signal ref'. The D-input of the flip-flop 42 receives the operation voltage VDD, the Q-output of the flip-flop 42 is coupled to the D-input of the flip-flop 43, and the Q-output of the flip-flop 43 outputs the frequency decrease signal DN. The two flip-flops 42 and 43 therefore act like a 2-bit shift register. If the comparison pulse signal fb' has two consecutive pulses without being reset by the reference pulse signal ref', then the frequency decrease signal DN will be outputted as the operation voltage VDD until it gets reset by the reference pulse signal ref'. Such a scenario occurs to activate the frequency decrease signal DN when the frequency of the comparison pulse signal fb' is higher than reference pulse signal ref'. When the frequency of the comparison pulse signal fb' is lower than reference pulse signal ref', no frequency decrease signal DN is activated since the two flip-flops 42 and 43 are reset by the reference pulse signal ref' before the operation voltage VDD can be outputted.

Figure 5:
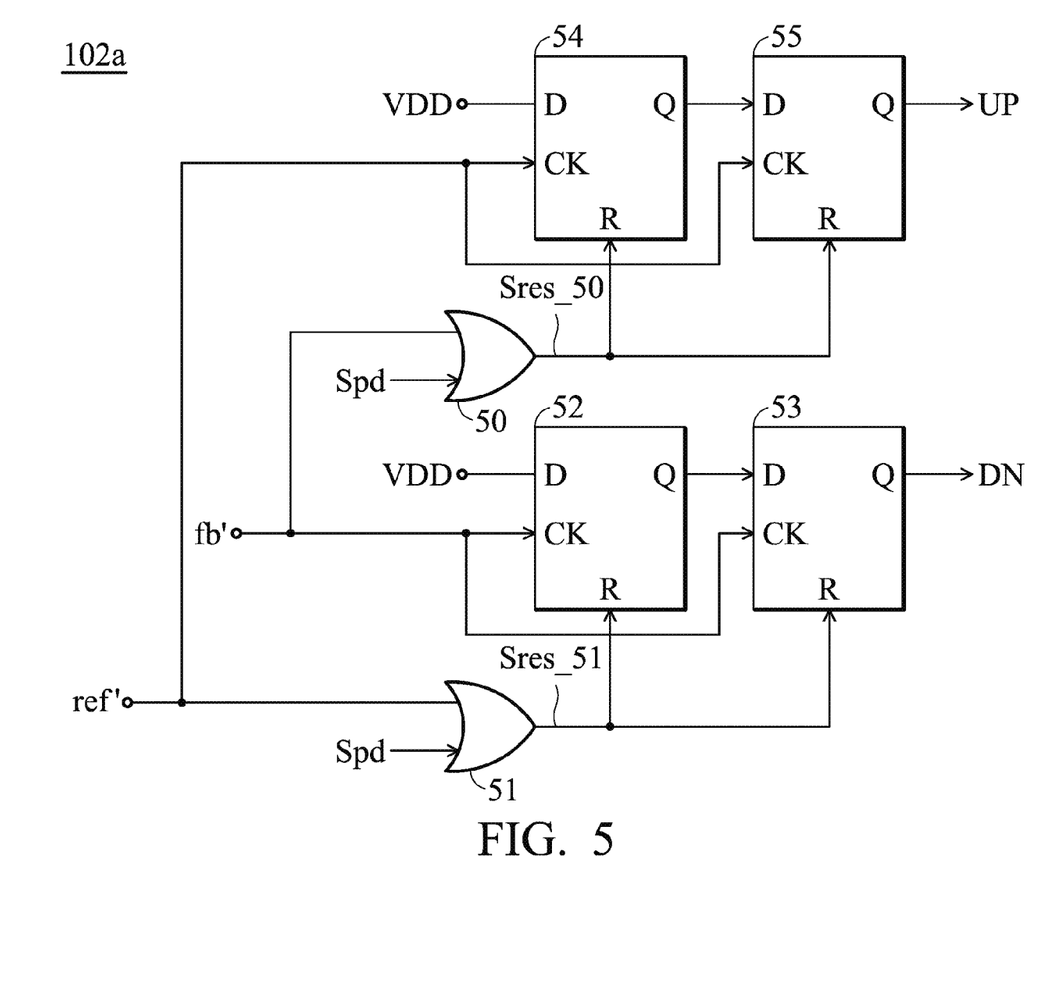
FIG. 5 shows another exemplary embodiment of a frequency controller of the signal generation device in FIG. 1.

FIG. 5 shows a detailed diagram of another exemplary embodiment of the frequency controller 102a. The frequency controller 102a comprises two pairs of cascaded flip-flops. The first pair of flip-flops 54 and 55 corresponds to the generation of the frequency increase signal UP, while the second pair of flip-flops 52 and 53 corresponds to the generation of the frequency decrease signal DN. The frequency controller 102a further comprises two OR gates 50 and 51. The working principles of the frequency controller 102a is similar to the frequency controller 102 in above, with the exception that the comparison pulse signal fb' is subjected to an OR operation with a power down signal Spd to generate a reset signal Sres_50 before being received by the RESET-inputs of the flip-flops 54 and 55, and the reference pulse signal ref' is subjected to an OR operation with the power down signal Spd to generate a reset signal Sres_51 before being received by the RESET-inputs of the flip-flops 52 and 53. The power down signal Spd under normal conditions is in logic "low"; therefore, the frequency controller 102a behaves the same way as the frequency controller 102 does in above. When the power down signal Spd is activated (in logic "high"), all flip-flops are forced to be reset. The power down signal Spd is activated during system power down to reset the flip-flops. In one embodiment, the flip-flops in FIG. 4 and FIG. 5 are D flip-flops.

Figure 6A:
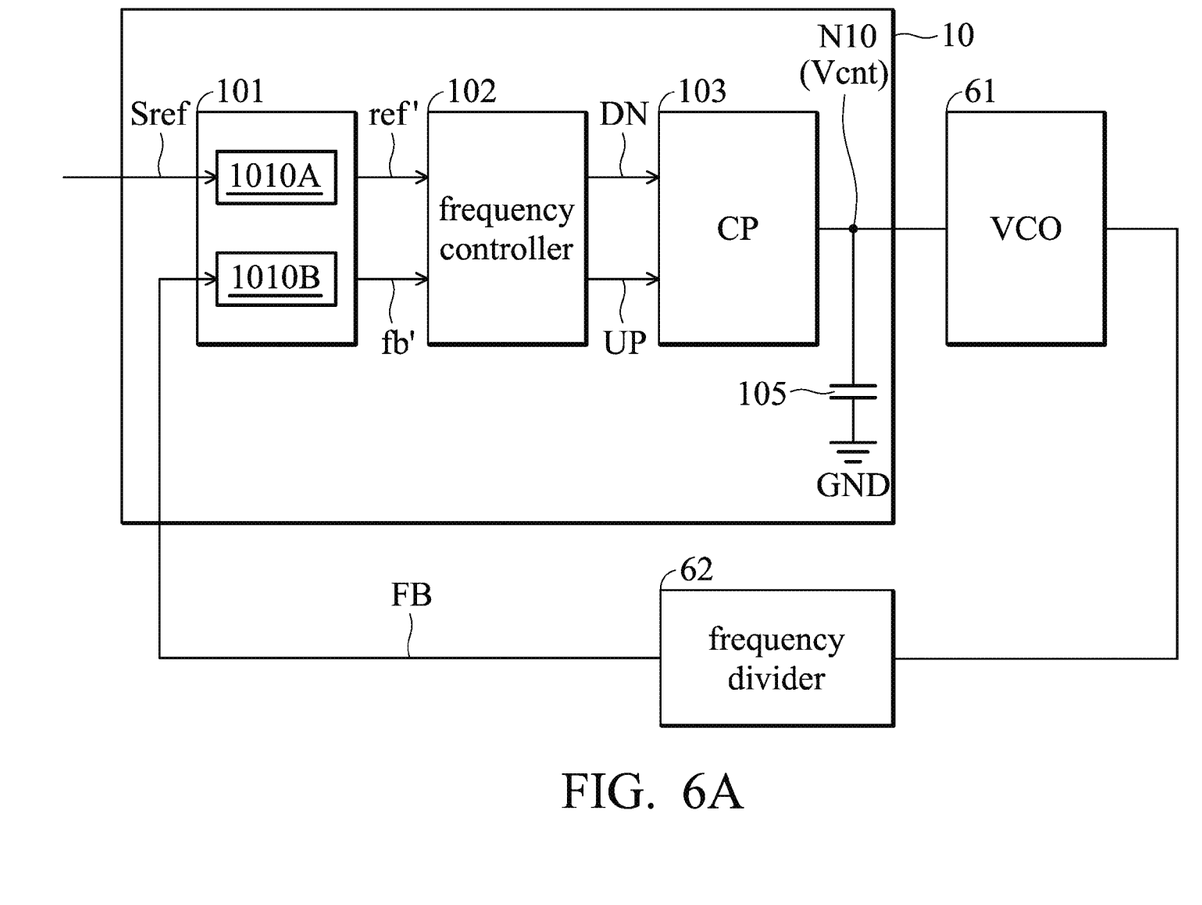
FIG. 6A shows an exemplary embodiment of a phase-locked loop.
Figure 6B:
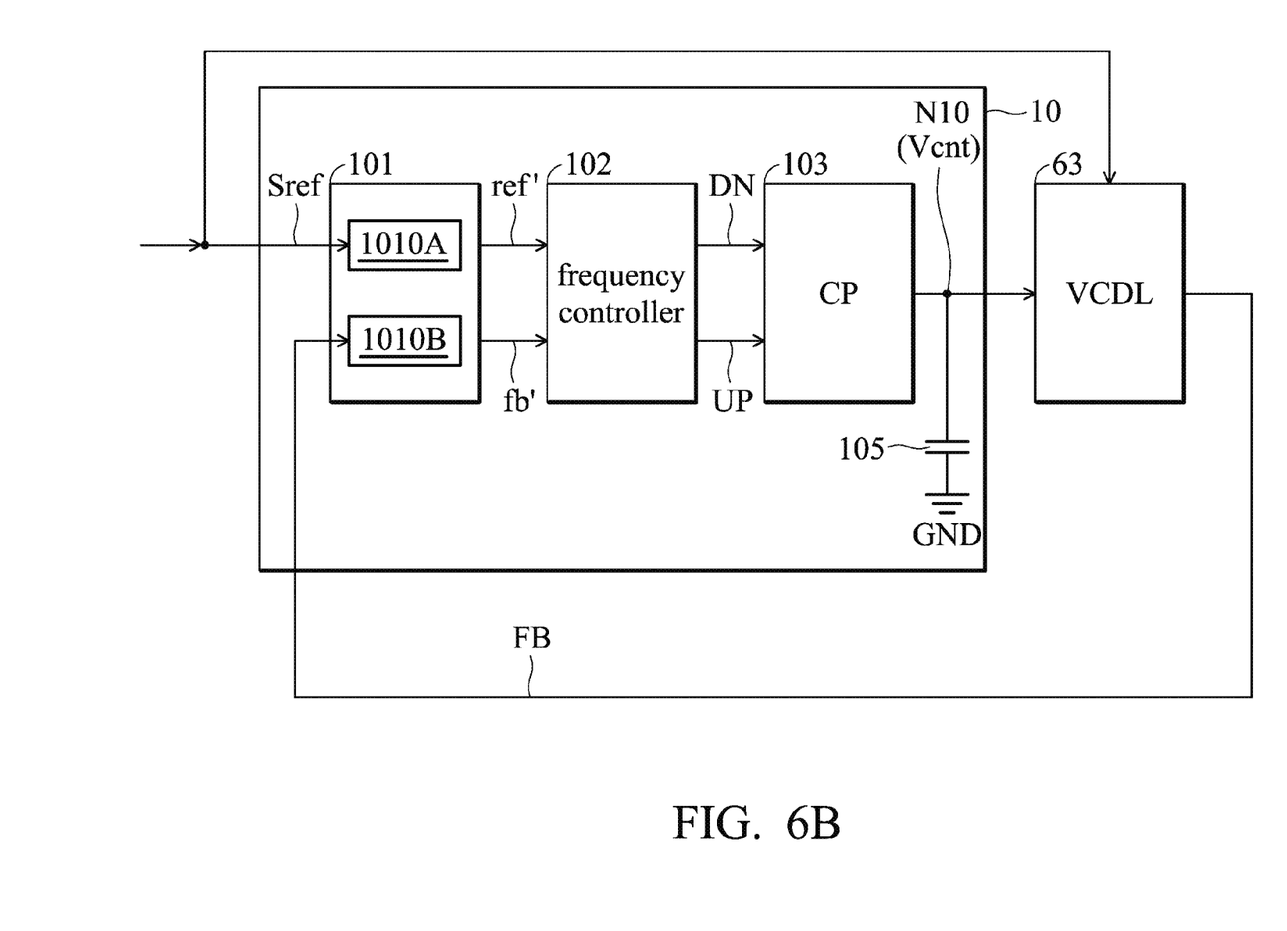
FIG. 6B shows an exemplary embodiment of a delay-locked loop.

Despite the frequency-control circuit 10 being demonstrated to function as part of a signal generation device 1 in the above embodiments, the invention is not limited thereto. In another embodiment, the frequency-control circuit 10 may be coupled to a VCO (voltage-controlled oscillator) 61 to control its frequency and/or phase, and establish a feedback loop (with an optional frequency divider 62) to act as a PLL (phase-locked loop) as shown in FIG. 6A. In still another embodiment, the frequency-control circuit 10 may be coupled to a voltage-controlled delay line (VCDL) 63 to control its time delay, and establish a feedback loop to act as a DLL (delay-locked loop) as shown in FIG. 6B. Therefore, in addition to voltage conversion, the frequency-control circuit 10 may also be utilized in PLL/DLL applications such as signal recovery, frequency synthesis, clock distribution, synchronization, FM signal demodulation, de-skewing, etc.

According to the above embodiment, compared with the prior arts, the frequency of the output signal Sout generated by the output circuit 11 can be controlled according to the control voltage Vcnt generated by the frequency-control circuit 10, such that the frequency of the output signal Sout can be adjusted to a desired frequency. The output frequency of Sout will match with the frequency of the control signal Scnt which in turn matches the frequency of the reference signal Sref when the frequency comparison process is completed. In other words, the frequency of the comparison result signal FB will match the frequency of the reference signal Sref. Since the frequency-control circuit 10 does not use capacitors with large capacitance values and resistors with large resistance values, and the frequency controller 102 utilizes digital logic flop-flops, the area occupied by the frequency-control circuit 10 is small and the whole area of the signal generation device 1 is decreased. Moreover, the transient response of the signal generation device 1 is fast. Therefore, the developed signal generation device 1 and frequency-control circuit 10 have the advantages of frequency stability and simple design.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A frequency-control circuit to match a frequency of a comparison result signal to a frequency of a reference signal, comprising:
    a pulse generator, generating a reference pulse signal according to a transition of the reference signal and a comparison pulse signal according to a transition of the comparison result signal, to re-shape the reference signal and the comparison result signal into narrow pulses suitable for clocking and resetting flip-flops, and
    a frequency controller, generating a frequency increase signal and a frequency decrease signal according to the reference pulse signal and the comparison pulse signal,
    wherein a voltage-control node is charged when the frequency increase signal is asserted and discharged when the frequency decrease signal is asserted, and
    wherein the frequency controller comprises:
    a first flip-flop, wherein a CLOCK-input of the first flip-flop receives the reference pulse signal, and a RESET-input thereof receives the comparison pulse signal; and
    a second flip-flop, wherein a D-input of the second flip-flop is coupled to a Q-output of the first flip-flop, a CLOCK-input thereof receives the reference pulse signal, a RESET-input thereof receives the comparison pulse signal, and a Q-output thereof outputs the frequency increase signal,
    wherein the frequency increase signal is asserted when more than one pulse of the reference pulse signal is received in one cycle of the comparison pulse signal.

2. The frequency-control circuit of claim 1, wherein the pulse generator comprises:
    a first monostable multivibrator generating the reference pulse signal according to the transition of the reference signal; and
    a second monostable multivibrator generating the comparison pulse signal according to the transition of the comparison result signal.

3. The frequency-control circuit of claim 1, wherein the first and the second flip-flops are reset during system power down.

4. The frequency-control circuit of claim 1, wherein the frequency controller comprises:
    a third flip-flop, wherein a CLOCK-input of the third flip-flop receives the comparison pulse signal, and a RESET-input thereof receives the reference pulse signal; and
    a fourth flip-flop, wherein a D-input of the fourth flip-flop is coupled to a Q-output of the third flip-flop, a CLOCK-input thereof receives the comparison pulse signal, a RESET-input thereof receives the reference pulse signal, and a Q-output thereof outputs the frequency decrease signal,
    wherein the frequency decrease signal is asserted when more than one pulse of the comparison pulse signal is received in one cycle of the reference pulse signal.

5. The frequency-control circuit of claim 4, wherein the third and the fourth flip-flops are reset during system power down.

6. The frequency-control circuit of claim 1, further comprising:
    a charge pump charging the voltage-control node when the frequency increase signal is asserted and discharging the voltage-control node when the frequency decrease signal is asserted.

7. The frequency-control circuit of claim 1, wherein the voltage-control node is coupled to a voltage-controlled oscillator to control a frequency or a phase of the voltage-controlled oscillator.

8. The frequency-control circuit of claim 1, wherein the voltage-control node is coupled to a voltage-controlled delay line to control a time delay of the voltage-controlled delay line.

9. The frequency-control circuit of claim 8, wherein the voltage-controlled delay line modulates a frequency of an output of a voltage converter.

10. A frequency controller to detect whether a frequency of a comparison pulse signal is higher or lower than a frequency of a reference pulse signal, comprising:
    a first flip-flop, wherein a CLOCK-input of the first flip-flop receives the reference pulse signal, and a RESET-input thereof receives the comparison pulse signal; and
    a second flip-flop, wherein a D-input of the second flip-flop is coupled to a Q-output of the first flip-flop, a CLOCK-input thereof receives the reference pulse signal, a RESET-input thereof receives the comparison pulse signal, and a Q-output thereof outputs a frequency increase signal;
    a third flip-flop, wherein a CLOCK-input of the third flip-flop receives the comparison pulse signal, and a RESET-input thereof receives the reference pulse signal; and
    a fourth flip-flop, wherein a D-input of the fourth flip-flop is coupled to a Q-output of the third flip-flop, a CLOCK-input thereof receives the comparison pulse signal, a RESET-input thereof receives the reference pulse signal, and a Q-output thereof outputs a frequency decrease signal,
    wherein the frequency increase signal is asserted when more than one pulse of the reference pulse signal is received in one cycle of the comparison pulse signal, and
    wherein the frequency decrease signal is asserted when more than one pulse of the comparison pulse signal is received in one cycle of the reference pulse signal.

11. The frequency controller of claim 10, wherein the first, second, third, and fourth flip-flops are reset during system power down.

* * * * *